(12) United States Patent
Kaneko et al.

(10) Patent No.: US 11,972,949 B2
(45) Date of Patent: Apr. 30, 2024

(54) SiC SUBSTRATE MANUFACTURING METHOD AND MANUFACTURING DEVICE, AND METHOD FOR REDUCING WORK-AFFECTED LAYER IN SiC SUBSTRATE

(71) Applicants: KWANSEI GAKUIN EDUCATIONAL FOUNDATION, Hyogo (JP); TOYOTA TSUSHO CORPORATION, Nagoya (JP)

(72) Inventors: Tadaaki Kaneko, Hyogo (JP); Natsuki Yoshida, Hyogo (JP); Kazufumi Aoki, Hyogo (JP)

(73) Assignees: KWANSEI GAKUIN EDUCATIONAL FOUNDATION, Hyogo (JP); TOYOTA TSUSHO CORPORATION, Nagoya (JP)

( * ) Notice: Subject to any disclaimer, the term of this patent is extended or adjusted under 35 U.S.C. 154(b) by 329 days.

(21) Appl. No.: 17/436,307

(22) PCT Filed: Mar. 3, 2020

(86) PCT No.: PCT/JP2020/008965
§ 371 (c)(1),
(2) Date: Sep. 3, 2021

(87) PCT Pub. No.: WO2020/179794
PCT Pub. Date: Sep. 10, 2020

(65) Prior Publication Data
US 2022/0181155 A1 Jun. 9, 2022

(30) Foreign Application Priority Data
Mar. 5, 2019 (JP) .................................. 2019-040071

(51) Int. Cl.
H01L 21/04 (2006.01)
H01L 21/3065 (2006.01)
H01L 21/67 (2006.01)

(52) U.S. Cl.
CPC ...... H01L 21/0445 (2013.01); H01L 21/3065 (2013.01); H01L 21/67069 (2013.01)

(58) Field of Classification Search
None
See application file for complete search history.

(56) References Cited

U.S. PATENT DOCUMENTS 6,015,465 A    1/2000   Kholodenko et al.
10,388,536 B2 * 8/2019   Torimi ................... C30B 33/12

FOREIGN PATENT DOCUMENTS

EP    3450595 A1    3/2019
EP    3936645 A1    1/2022
(Continued)

OTHER PUBLICATIONS

Search Report from European Application No. 20766741.1 dated Dec. 2, 2022 (9 pages).
(Continued)

*Primary Examiner* — Roberts P Culbert
(74) *Attorney, Agent, or Firm* — Calfee, Halter & Griswold LLP

(57) ABSTRACT

A device for manufacturing a SiC substrate, in which the occurrence of a work-affected layer is reduced, or from which a work-affected layer is removed, comprises: a main container which can accommodate a SiC substrate and which generates, by heating, a vapor pressure of a vapor-phase species including elemental Si and a vapor-phase species including elemental C in an internal space; and a heating furnace for accommodating the main container, generating a vapor pressure of the vapor-phase species (Continued)

including elemental Si in the internal space, and heating so that a temperature gradient is formed; the main container having an etching space formed by causing a portion of the main container disposed on the low-temperature side of the temperature gradient and the SiC substrate to face each other in a state in which the SiC substrate is disposed on the high-temperature side of the temperature gradient.

9 Claims, 3 Drawing Sheets

(56) References Cited

FOREIGN PATENT DOCUMENTS

| | | |
|---|---|---|
| JP | 2005225710 A | 8/2005 |
| JP | 2008016691 A | 1/2008 |
| JP | 2015196616 A | 11/2015 |
| JP | 2017066019 A | 4/2017 |
| WO | 2016079983 A1 | 5/2016 |
| WO | 2017188381 A1 | 11/2017 |
| WO | 2019022054 A1 | 1/2019 |

OTHER PUBLICATIONS

International Search Report from PCT/JP2020/008965 dated Apr. 7, 2020 (4 pages).

* cited by examiner

SiC SUBSTRATE MANUFACTURING METHOD AND MANUFACTURING DEVICE, AND METHOD FOR REDUCING WORK-AFFECTED LAYER IN SiC SUBSTRATE

CROSS-REFERENCE TO RELATED APPLICATIONS

This application is a 371 of PCT Application No. PCT/JP2020/008965 filed on Mar. 3, 2020, which claims priority to Japanese Application No. 2019-040071, filed on Mar. 5, 2019, the contents of which are hereby incorporated by reference as if recited in their entirety.

TECHNICAL FIELD

The present invention relates to a method for manufacturing a SiC substrate from which a work-affected layer has been removed, a device for manufacturing the SiC substrate, and a method for reducing a work-affected layer of a SiC substrate.

BACKGROUND ART

A silicon carbide (SiC) substrate is formed by mechanically processing (slicing, grinding, and polishing) an ingot of single crystal SiC prepared by a sublimation method or the like. On the surface of the SiC substrate subjected to mechanical processing, there is a surface layer (hereinafter, referred to as a work-affected layer) having scratches, crystal distortion, and the like introduced during processing. In order not to lower the yield in the device manufacturing process, it is necessary to remove the work-affected layer.

Conventional removal of a work-affected layer has been mainly performed by surface processing using abrasive grains such as diamond. In recent years, various proposals have been made for a technique that does not use abrasive grains.

For example, Patent Literature 1 discloses an etching technique (hereinafter, also referred to as Si vapor pressure etching) in which etching is performed by heating a SiC wafer under Si vapor pressure.

CITATION LIST

Patent Literature

Patent Literature 1: JP 2008-16691 A

SUMMARY OF INVENTION

Technical Problem

An object of the present invention is to provide a method for manufacturing a SiC substrate in which a work-affected layer is reduced, and a device for manufacturing the SiC substrate. An object of the present invention is also to provide a method for manufacturing a SiC substrate in which a work-affected layer is removed, and a device for manufacturing the SiC substrate.

Solution to Problem

In order to solve the above problem, a device for manufacturing a SiC substrate according to an aspect of the present invention includes: a main container capable of accommodating a SiC substrate and configured to generate vapor pressure of a gaseous species containing Si element and a gaseous species containing C element in an internal space by heating; and a heating furnace that accommodates the main container, generates vapor pressure of a gaseous species containing Si element in an internal space, and performs heating in a manner to form a temperature gradient, and the main container including an etching space formed by making a portion of the main container arranged on a low temperature side of the temperature gradient face the SiC substrate in a state where the SiC substrate is arranged on a high temperature side of the temperature gradient.

As described above, the SiC substrate can be etched without using machining by arranging the SiC substrate in the main container that generates vapor pressure of a gaseous species containing Si element and a gaseous species containing C element in an internal space and making the SiC substrate face a portion of the main container having a temperature lower than that of the SiC substrate. As a result, the SiC substrate from which the work-affected layer is reduced or removed can be manufactured.

In this aspect, the main container includes a substrate holder provided between the SiC substrate and the main container.

As described above, by providing the substrate holder between the SiC substrate and the main container, the etching space can be easily formed.

In this aspect, the main container is made of a material containing polycrystalline SiC.

As described above, in a case where the main container is made of a material containing polycrystalline SiC, vapor pressure of a gaseous species containing Si element and a gaseous species containing C element can be generated in the main container when the main container is heated by the heating furnace.

In this aspect, the heating furnace includes a high melting point container capable of accommodating the main container, and a Si vapor supply source capable of supplying Si vapor into the high melting point container.

As described above, since the heating furnace includes the high melting point container and the Si vapor supply source, the main container can be heated under the Si vapor pressure environment. This makes it possible to suppress a decrease in vapor pressure of the gaseous species containing Si element in the main container.

In this aspect, the high melting point container is made of a material containing tantalum, and the Si vapor supply source is tantalum silicide.

The present invention also relates to a method for manufacturing a SiC substrate. That is, a method for manufacturing a SiC substrate according to an aspect of the present invention includes an etching process of etching a SiC substrate by accommodating the SiC substrate inside a main container that generates vapor pressure of a gaseous species containing Si element and a gaseous species containing C element in an internal space, and heating the main container in a manner to form a temperature gradient under an environment of vapor pressure of the gaseous species containing Si element.

As described above, by etching the SiC substrate using the temperature gradient as the driving force in the environment of the vapor pressure of the gaseous species containing Si element and the gaseous species containing the C element, it is possible to manufacture the SiC substrate from which the work-affected layer has been reduced or removed.

In this aspect, the etching process includes a Si atom sublimation process of thermally sublimating Si atoms from the surface of the SiC substrate, and a C atom sublimation process of sublimating C atoms from the surface of the SiC substrate by reacting C atoms remaining on the surface of the SiC substrate with Si vapor in the main container.

In this aspect, in the etching process, the SiC substrate arranged on the high temperature side of the temperature gradient and a portion of the main container arranged on the low temperature side of the temperature gradient are etched while facing each other.

The present invention also relates to a method for reducing a work-affected layer of a SiC substrate. That is, a method for reducing a work-affected layer of a SiC substrate according to an aspect of the present invention includes an etching process of etching a SiC substrate under a vapor pressure environment of a gaseous species containing Si element and a gaseous species containing C element, and the etching process is a process of heating an etching space in which the SiC substrate is arranged on a high temperature side of a temperature gradient.

In this aspect, the etching process is a process of arranging the SiC substrate in an etching space in which air is exhausted through an environment of vapor pressure of a gaseous species containing Si element and etching the SiC substrate.

In this aspect, the etching process is a process in which the SiC substrate arranged on the high temperature side of the temperature gradient and a portion of the main container arranged on the low temperature side of the temperature gradient are etched while facing each other.

The present invention also relates to a method for manufacturing a SiC substrate. That is, a method for manufacturing a SiC substrate according to an aspect of the present invention includes an etching process of etching a SiC substrate under a vapor pressure environment of a gaseous species containing Si element and a gaseous species containing C element, and the etching process is a process of heating an etching space in which the SiC substrate is arranged on a high temperature side of a temperature gradient.

In this aspect, the etching process is a process of arranging the SiC substrate in an etching space in which air is exhausted through an environment of vapor pressure of a gaseous species containing Si element and etching the SiC substrate.

In this aspect, the etching process is a process in which the SiC substrate arranged on the high temperature side of the temperature gradient and a portion of the main container arranged on the low temperature side of the temperature gradient are etched while facing each other.

The present invention also relates to a device for manufacturing a SiC substrate. That is, a device for manufacturing a SiC substrate according to an aspect of the present invention includes: a main container capable of accommodating a SiC substrate and configured to generate vapor pressure of a gaseous species containing Si element and a gaseous species containing C element in an internal space by heating; and a heating furnace that accommodates the main container, generates vapor pressure of a gaseous species containing Si element in an internal space, and performs heating in a manner to form a temperature gradient, the main container including an etching space in which the SiC substrate is arranged on a high temperature side of the temperature gradient.

In this aspect, the main container includes a substrate holder capable of holding at least a part of the SiC substrate in a hollow space of the main container.

Advantageous Effects of Invention

According to the disclosed technology, it is possible to provide a method for manufacturing a SiC substrate in which a work-affected layer is reduced, and a device for manufacturing the SiC substrate. According to the disclosed technology, it is possible to provide a method for manufacturing a SiC substrate in which a work-affected layer is removed, and a device for manufacturing the SiC substrate.

Other problems, features and advantages will become apparent from reading of the following Description of Embodiments when taken up in conjunction with the drawings and claims.

DESCRIPTION OF EMBODIMENTS

Figure 1:
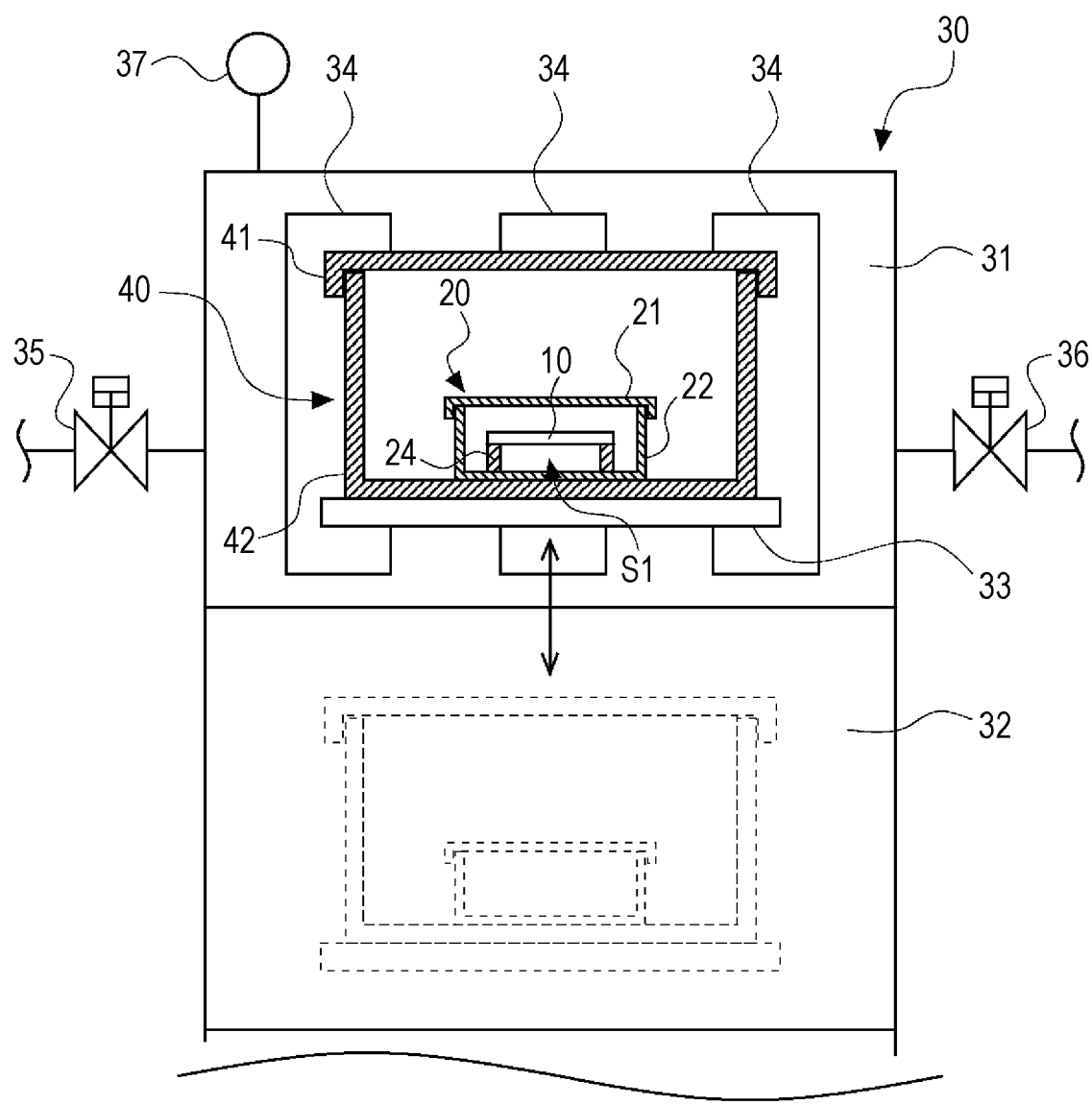
FIG. 1 is a schematic view of a device for manufacturing a SiC substrate according to an embodiment.

Hereinafter, a preferred embodiment of the present invention illustrated in the drawings will be described in detail with reference to FIGS. 1 to 6. The technical scope of the present invention is not limited to the embodiments illustrated in the accompanying drawings, and can be appropriately changed within the scope described in the claims.

[Device for Manufacturing SiC Substrate]

Hereinafter, a device for manufacturing a SiC substrate according to an embodiment of the present invention will be described in detail.

As illustrated in FIG. 1, a device for manufacturing a SiC substrate according to the present embodiment includes: a main container 20 capable of accommodating a SiC substrate 10 and configured to generate vapor pressure of a gaseous species containing Si element and a gaseous species containing C element in an internal space by heating; and a heating furnace 30 that accommodates the main container 20, generates vapor pressure of a gaseous species containing Si element in an internal space, and performs heating in a manner to form a temperature gradient.

The main container 20 includes: an etching space S1 formed by making a portion of the main container 20 arranged on the low temperature side of the temperature gradient face the SiC substrate 10 in a state where the SiC substrate 10 is arranged on the high temperature side of the temperature gradient.

Figure 2:
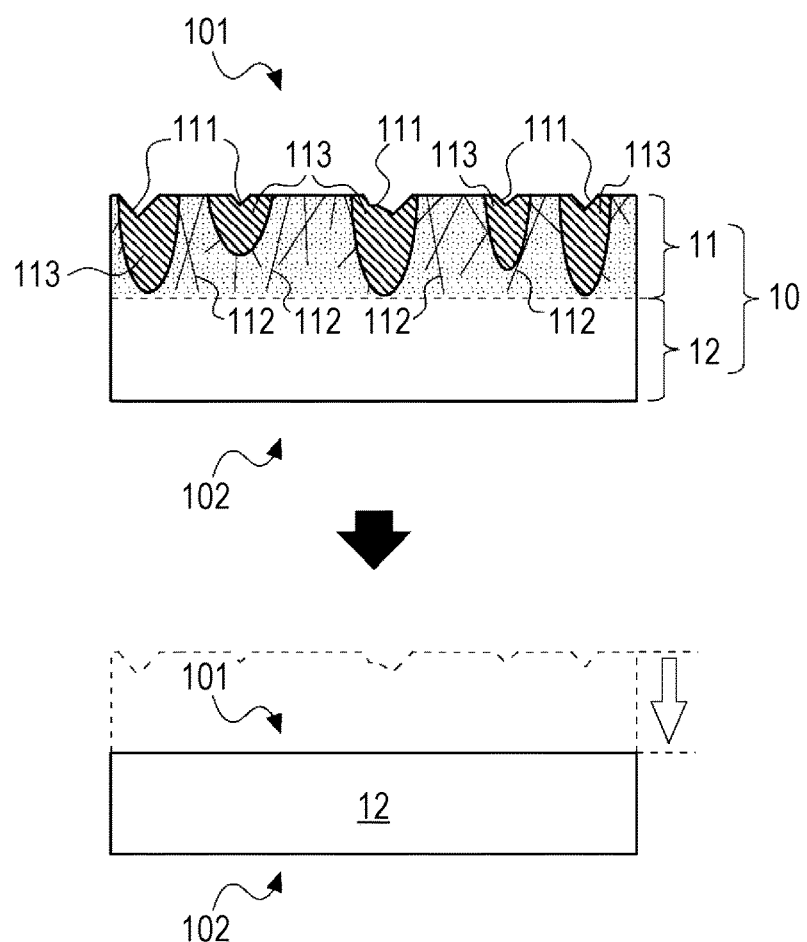
FIG. 2 is an explanatory view of a SiC substrate etched by the device for manufacturing a SiC substrate according to the embodiment.

By using such a device for manufacturing a SiC substrate, as illustrated in FIG. 2, a SiC substrate in which the work-affected layer 11 is removed can be manufactured.

<SiC Substrate 10>

Examples of the SiC substrate 10 can include a SiC wafer obtained by slicing an ingot produced by a sublimation method or the like into a disk shape, and a SiC substrate obtained by processing single crystal SiC into a thin plate shape. As the crystal polymorph of the single crystal SiC, any polytype can be adopted.

Generally, as illustrated in FIG. 2, the SiC substrate 10 subjected to mechanical processing (for example, slicing, grinding, and polishing) or laser processing includes a work-affected layer 11 into which processing damage such as a flaw 111, a latent flaw 112, and a strain 113 is introduced, and a bulk layer 12 into which such processing damage is not introduced.

The presence or absence of the work-affected layer 11 can be checked by the SEM-EBSD method, TEM, pXRD, RAMAN spectroscopy, or the like. In order not to lower the yield in the device manufacturing process, it is preferable to remove the work-affected layer 11 and expose the bulk layer 12 into which no processing damage is introduced.

In the description of the present specification, a surface of the SiC substrate 10 on which the semiconductor element is formed (specifically, a surface on which the epilayer is deposited) is referred to as a main surface 101, and a surface facing the main surface 101 is referred to as a back surface 102. The main surface 101 and the back surface 102 are collectively referred to as a surface, and a direction penetrating the main surface 101 and the back surface 102 is referred to as a front and back direction.

As the main surface 101, a surface provided with an off angle of several degrees (for example, 0.4 to 8°) from (0001) surface or (000-1) surface can be exemplified. (In the present specification, in the notation of the Miller indices, "-" means a bar attached to the index immediately after the Miller indices).

As the size of the SiC substrate 10, a chip size of several centimeters square, a 6-inch wafer or an 8-inch wafer can be exemplified.

<Main Container 20>

It is sufficient that the main container 20 is configured to accommodate the SiC substrate 10 and generate vapor pressure of a gaseous species containing Si element and a gaseous species containing C element in an internal space during the heat treatment. For example, the main container 20 is made of a material containing polycrystalline SiC. In the present embodiment, the entire main container 20 is made of polycrystalline SiC. By heating the main container 20 made of such a material, vapor pressure of a gaseous species containing Si element and a gaseous species containing C element can be generated.

That is, the environment in the heat-treated main container 20 is desirably a vapor pressure environment of a mixed system of a gaseous species containing Si element and a gaseous species containing the C element. Examples of the gaseous species containing Si element include Si, $Si_2$, $Si_3$, $Si_2C$, $SiC_2$, and SiC. Examples of the gaseous species containing the C element include $Si_2C$, $SiC_2$, SiC, and C. That is, the SiC-based gas exists in the main container 20.

The configuration can be adopted as long as the configuration can generate vapor pressure of a gaseous species containing Si element and a gaseous species containing C element in the internal space during the heating treatment of the main container 20. For example, a configuration in which polycrystalline SiC is exposed on a part of the inner surface, a configuration in which polycrystalline SiC is separately arranged in the main container 20, and the like can be shown.

Figure 3:
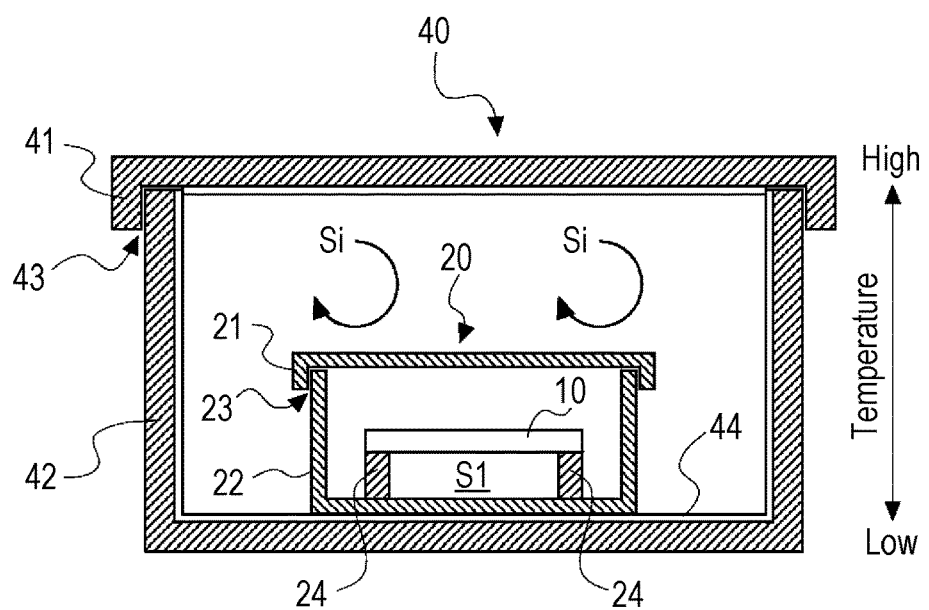
FIG. 3 is an explanatory view of the device for manufacturing the SiC substrate according to the embodiment.

As illustrated in FIG. 3, the main container 20 is a fitting container including an upper container 21 and a lower container 22 that can be fitted to each other. A minute gap 23 is formed in a fitting portion between the upper container 21 and the lower container 22, and the inside of the main container 20 can be exhausted (evacuated) from the gap 23.

The main container 20 includes an etching space S1 formed by making a portion of the main container 20 arranged on the low temperature side of the temperature gradient face the SiC substrate 10 in a state where the SiC substrate 10 is arranged on the high temperature side of the temperature gradient. That is, at least a portion of the main container 20 (for example, the bottom surface of the lower container 22) becomes lower in temperature than the SiC substrate 10 due to the temperature gradient provided in the heating furnace 30, and thereby, the etching space S1 is formed.

The etching space S1 is a space for transporting Si atoms and C atoms on the surface of the SiC substrate 10 to the main container 20 by using a temperature difference provided between the SiC substrate 10 and the main container 20 as a driving force.

Figure 4:
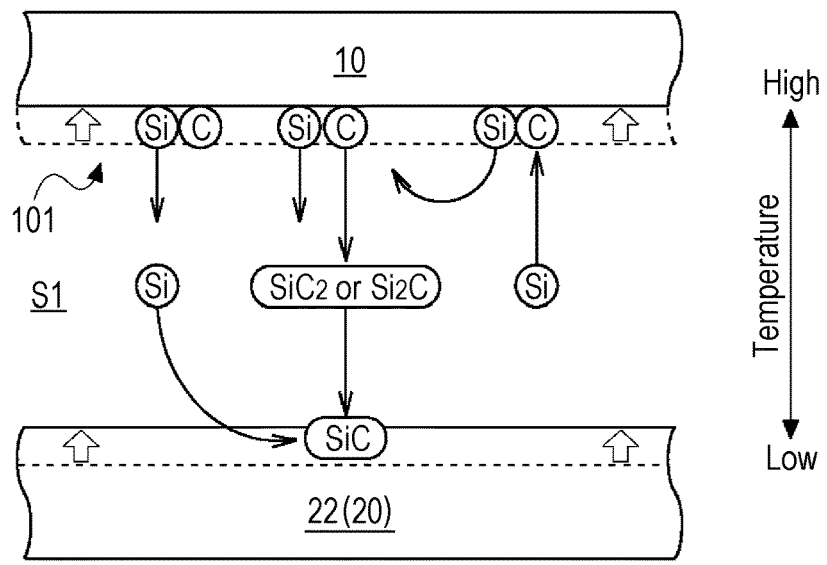
FIG. 4 is an explanatory view of an etching process of the method for manufacturing a SiC substrate according to the embodiment.

For example, the SiC substrate 10 is arranged such that the temperature on the main surface 101 side is high and the temperature of the bottom surface side of the lower container 22 is low when the temperature of the main surface 101 (or back surface 102) of the SiC substrate 10 is compared with the temperature of the bottom surface of the lower container 22 facing the main surface 101 (see FIG. 4). As described above, by forming the space (etching space S1) provided with a temperature difference between the main surface 101 and the bottom surface of the lower container 22, Si atoms and C atoms of the main surface 101 can be transported to the bottom surface of the lower container 22 by using the temperature difference as a driving force.

The main container 20 may include a substrate holder 24 provided between the SiC substrate 10 and the main container 20.

The heating furnace 30 according to the present embodiment is configured to perform heating so as to form a temperature gradient so that the temperature decreases from the upper container 21 toward the lower container 22 of the main container 20. Therefore, by providing the substrate holder 24 capable of holding the SiC substrate 10 between the SiC substrate 10 and the lower container 22, the etching space S1 can be formed between the SiC substrate 10 and the lower container 22.

It is sufficient that the substrate holder 24 is configured to hold at least a part of the SiC substrate 10 in the hollow space of the main container 20. For example, a conventional support means such as a one-point support, a three-point support, a configuration for supporting an outer peripheral edge, or a configuration for clamping a part thereof can be naturally employed. As a material of the substrate holder 24, a SiC material or a high melting point metal material can be adopted.

The substrate holder 24 may not be provided depending on the direction of the temperature gradient of the heating furnace 30. For example, when the heating furnace 30 forms a temperature gradient such that the temperature decreases from the lower container 22 toward the upper container 21, the SiC substrate 10 may be arranged on the bottom surface of the lower container 22 (without providing the substrate holder 24).

<Heating Furnace 30>

As illustrated in FIG. 1, the heating furnace 30 includes a main heating chamber 31 capable of heating a workpiece (SiC substrate 10 or the like) to a temperature of 1000° C. or higher and 2300° C. or lower; a preheating chamber 32 capable of preheating the workpiece to a temperature of 500° C. or higher; a high melting point container 40 capable of accommodating the main container 20; and a moving unit 33 (moving table) capable of moving the high melting point container 40 from the preheating chamber 32 to the main heating chamber 31.

The main heating chamber 31 has a regular hexagonal shape in planar cross-sectional view, and the high melting point container 40 is arranged inside the main heating chamber 31.

A heater 34 (mesh heater) is provided inside the main heating chamber 31. A multilayer heat reflective metal plate is fixed to a side wall and a ceiling of the main heating chamber 31 (not illustrated). The multilayer heat reflective metal plate is configured to reflect heat of the heater 34 toward a substantially central portion of the main heating chamber 31.

As a result, in the main heating chamber 31, the heater 34 is arranged so as to surround the high melting point container 40 in which the workpiece is accommodated, and the multilayer heat reflective metal plate is arranged on the outer side thereof, so that the temperature can be raised to a temperature of 1000° C. or higher and 2300° C. or lower.

As the heater 34, for example, a resistance heating type heater or a high frequency induction heating type heater can be used.

The heater 34 may adopt a configuration capable of forming a temperature gradient in the high melting point container 40. For example, the heater 34 may be configured such that many heaters are arranged on the upper side (or lower side). Further, the heater 34 may be configured such that the width increases toward the upper side (or lower side). Alternatively, the heater 34 may be configured to be able to increase the power supplied toward the upper side (or lower side).

A vacuum forming valve 35 for exhausting the inside of the main heating chamber 31, an inert gas injection valve 36 for introducing an inert gas into the main heating chamber 31, and a vacuum gauge 37 for measuring the degree of vacuum in the main heating chamber 31 are connected to the main heating chamber 31.

The vacuum forming valve 35 is connected to an evacuation pump that exhausts and evacuates the inside of the main heating chamber 31 (not illustrated). The degree of vacuum in the main heating chamber 31 can be adjusted to, for example, 10 Pa or lower, more preferably 1 Pa or lower, and still more preferably $10^{-3}$ Pa or lower by the vacuum forming valve 35 and the evacuation pump. Examples of the evacuation pump can include a turbo molecular pump.

The inert gas injection valve 36 is connected to an inert gas supply source (not illustrated). By the inert gas injection valve 36 and the inert gas supply source, the inert gas can be introduced into the main heating chamber 31 in the range of $10^{-5}$ to 10000 Pa. As the inert gas, Ar, He, $N_2$, or the like can be selected.

The preheating chamber 32 is connected to the main heating chamber 31, and is configured to be able to move the high melting point container 40 by the moving means 33. The preheating chamber 32 of the present embodiment is configured to be capable of raising the temperature by residual heat of the heater 34 of the main heating chamber 31. For example, when the temperature of the main heating chamber 31 is raised to 2000° C., the temperature of the preheating chamber 32 is raised to about 1000° C., and the object to be processed (SiC substrate 10, main container 20, high melting point container 40, and the like) can be degassed.

The moving means 33 is configured to be able to move the main heating chamber 31 and the preheating chamber 32 with the high melting point container 40 placed thereon. Since the transportation between the main heating chamber 31 and the preheating chamber 32 by the moving means 33 is completed in about 1 minute at the shortest, it is possible to realize temperature rise and temperature drop at 1 to 1000° C./min.

Since the rapid temperature raise and the rapid temperature drop can be performed in this manner, it is possible to observe a surface shape having no low-temperature growth history during temperature rise and temperature drop, which is difficult in conventional devices.

In FIG. 1, the preheating chamber 32 is arranged below main heating chamber 31. However, the present invention is not limited to this, and the preheating chamber 42 may be arranged in any direction.

The moving means 33 according to the present embodiment is a moving table on which the high melting point container 40 is placed. The minute heat is released from the contact portion between the moving table and the high melting point container 40. As a result, a temperature gradient can be formed in the high melting point container 40.

In the heating furnace 30 of the present embodiment, since the bottom of the high melting point container 40 is in contact with the moving table, a temperature gradient is provided so that the temperature decreases from the upper container 41 toward the lower container 42 of the high melting point container 40.

The direction of this temperature gradient can be set to any direction by changing the position of the contact portion between the moving table and the high melting point container 40. For example, in a case where a suspension type or the like is adopted for the moving table and the contact portion is provided on the ceiling of the high melting point container 40, heat is transferred upward. Therefore, the temperature gradient is provided such that the temperature rises from the upper container 41 toward the lower container 42 of the high melting point container 40. This temperature gradient is desirably formed along the front and back direction of the SiC substrate 10.

As described above, the temperature gradient may be formed by the configuration of the heater 34.

<High Melting-Point Container 40>

The vapor pressure environment of the gaseous species containing Si element in the heating furnace 30 according to the present embodiment is formed using the high melting point container 40 and the Si vapor supply source 44. For example, any method capable of forming a vapor pressure environment of a gaseous species containing Si element around the main container 20 can be employed in the device for manufacturing a SiC substrate of the present invention.

The high-melting-point container 40 contains a high melting point material. For example, C which is a general-purpose heat-resistant member, W, Re, Os, Ta, and Mo which are high melting point metals, $Ta_9C_8$, HfC, TaC, NbC, ZrC, $Ta_2C$, TiC, WC, and MoC which are carbides, HfN, TaN, BN, $Ta_2N$, ZrN, and TiN which are nitrides, $HfB_2$, $TaB_2$, $ZrB_2$, $NB_2$, $TiB_2$ which are borides, polycrystalline SiC, and the like can be exemplified.

As similar to the main container 20, the high melting point container 40 is a fitting container including an upper container 41 and a lower container 42 that can be fitted to each other, and is configured to be able to accommodate the main container 20. A minute gap 43 is formed in a fitting portion between the upper container 41 and the lower container 42, and the inside of the high melting point container 40 can be exhausted (evacuated) from the gap 43.

The high melting point container 40 preferably includes a Si vapor supply source 44 capable of supplying vapor pressure of a vapor phase species containing Si element into the high melting point container 40. It is sufficient that the Si vapor supply source 44 is configured to generate Si vapor in the high melting point container 40 at the time of heat treatment, and for example, solid Si (Si pellet such as a single crystal Si piece or Si powder) or a Si compound can be exemplified.

The device for manufacturing a SiC substrate according to the present embodiment employs TaC as the material of the high melting point container 40, and employs tantalum silicide as the Si vapor supply source 44. That is, as illustrated in FIG. 3, a tantalum silicide layer is formed inside the high melting point container 40, and vapor pressure containing Si element is supplied into the container from the tantalum silicide layer during the heat treatment, so that a Si vapor pressure environment is formed.

In addition, any configuration can be adopted as long as the vapor pressure of the gaseous species containing Si element is formed in the high melting point container 40 during the heat treatment.

A device for manufacturing a SiC substrate according to the present invention includes: a main container 20 that accommodates a SiC substrate 10 and is configured to generate vapor pressure of a gaseous species containing Si element and a gaseous species containing C element in an internal space by heating; and a heating furnace 30 that accommodates the main container 20, generates vapor pressure of a gaseous species containing Si element in an internal space, and performs heating in a manner to form a temperature gradient, the main container 20 including an etching space S1 formed by making a portion of the main container 20 arranged on a low temperature side of the temperature gradient face the SiC substrate 10 in a state where the SiC substrate is arranged on a high temperature side of the temperature gradient.

With such a configuration, a near-thermal equilibrium state can be formed between the SiC substrate 10 and the main container 20, and a vapor pressure (partial pressure of gaseous species such as Si, $Si_2$, $Si_3$, $Si_2C$, $SiC_2$, and SiC) environment of a gaseous species containing Si element and a gaseous species containing C element can be formed in the main container 20. In such an environment, mass transport occurs using the temperature gradient of the heating furnace 30 as a driving force, and as a result, the SiC substrate 10 is etched, so that it is possible to manufacture the SiC substrate in which the work-affected layer 11 is reduced or removed.

According to a SiC substrate manufacturing device according to the present embodiment, the main container 20 is heated under the vapor pressure environment (for example, the Si vapor pressure environment) of the gaseous species containing Si element, and thereby, the gaseous species containing Si element can be suppressed from being exhausted from the inside of the main container 20. That is, by balancing the vapor pressure of the gaseous species containing Si element in the main container 20 and the vapor pressure of the gaseous species containing Si element outside the main container 20, the environment in the main container 20 can be maintained.

In other words, the main container 20 is arranged in the high melting point container 40 in which a vapor pressure environment (for example, a Si vapor pressure environment) of a gaseous species containing Si element is formed. As described above, the inside of the main container 20 is exhausted (evacuated) via the vapor pressure environment (for example, the Si vapor pressure environment) of the gaseous species containing Si element, so that it is possible to suppress a decrease in Si atoms from the inside of the etching space S1. As a result, the atomic number ratio Si/C preferable for etching can be maintained in the etching space S1 for a long time.

According to the device for manufacturing a SiC substrate according to the present embodiment, the main container 20 is made of polycrystalline SiC. With such a configuration, when the main container 20 is heated using the heating furnace 30, only the vapor pressure of the gaseous species containing Si element and the gaseous species containing the C element can be generated in the main container 20.

[Method for Manufacturing SiC Substrate]

Hereinafter, a method for manufacturing a SiC substrate according to an embodiment of the present invention will be described in detail.

As illustrated in FIGS. 3 and 4, the method for manufacturing a SiC substrate according to the present embodiment includes an etching process of etching a SiC substrate 10 by accommodating the SiC substrate 10 inside a main container 20 that generates vapor pressure of a gaseous species containing Si element and a gaseous species containing C element in an internal space, and heating the main container 20 in a manner to form a temperature gradient under an environment of vapor pressure of the gaseous species containing Si element.

In this embodiment, the same reference signs are given to components that are basically the same as those in the above device for manufacturing a SiC substrate, and the description thereof will be simplified.

Hereinafter, the etching process of the method for manufacturing a SiC substrate according to the present embodiment will be described in detail.

<Etching Process>

FIG. 4 is an explanatory diagram illustrating an outline of an etching mechanism. It is considered that, by heating the main container 20 in which the SiC substrate 10 is arranged in a temperature range of equal to or higher than 1400° C. and equal to or lower than 2300° C., the reactions of the following 1) to 5) are continuously performed, and as a result, etching proceeds.

$$SiC(s) \rightarrow Si(v) + C(s) \qquad 1)$$

$$2C(s) + Si(v) \rightarrow SiC_2(v) \qquad 2)$$

$$C(s) + 2Si(v) \rightarrow Si_2C(v) \qquad 3)$$

$$Si(v) + SiC_2(v) \rightarrow 2SiC(s) \qquad 4)$$

$$Si_2C(v) \rightarrow Si(v) + SiC(s) \qquad 5)$$

Explanation of 1): When the SiC substrate 10 (SiC(s)) is heated, Si atoms (Si (v)) are desorbed from the surface of the SiC substrate 10 by thermal decomposition (Si atom sublimation process).

Explanation of 2) and 3): C (C(s)) remaining on the surface of the SiC substrate 10 due to desorption of Si atoms (Si(v)) reacts with Si vapor (Si(v)) in the main container 20 to become $Si_2C$, $SiC_2$, or the like, and is sublimated from the surface of the SiC substrate 10 (C atom sublimation process).

Explanation of 4) and 5): Sublimed $Si_2C$, $SiC_2$, or the like reaches the bottom surface (polycrystalline SiC) in the main container 20 by a temperature gradient and grows.

That is, the etching process includes a Si atom sublimation process of thermally sublimating Si atoms from the surface of the SiC substrate 10, and a C atom sublimation process of sublimating C atoms from the surface of the SiC substrate 10 by reacting C atoms remaining on the surface of the SiC substrate 10 with Si vapor in the main container 20.

In the etching process, the SiC substrate 10 arranged on the high temperature side of the temperature gradient and a portion of the main container 20 arranged on the low temperature side of the temperature gradient are etched while facing each other.

That is, the etching space S1 is formed between the main surface 101 of the SiC substrate 10 and the bottom surface of the main container 20 lower in temperature than the main surface 101 by arranging the main surface 101 and the bottom surface to face each other. In the etching space S1, mass transport occurs using the temperature gradient formed by the heating furnace 30 as a driving force, and as a result, the SiC substrate 10 can be etched.

In other words, in the etching process, the SiC substrate 10 and a portion of the main container 20 are arranged to face each other, and heating is performed with a temperature gradient so that a portion of the main container 20 is on the low temperature side and the SiC substrate 10 is on the high temperature side. With this temperature gradient, the Si element and the C element are transported from the SiC substrate 10 to the main container 20, and the SiC substrate 10 is etched.

The etching temperature in this method is preferably set in a range of 1400 to 2300° C., and more preferably set in a range of 1600 to 2000° C.

The etching rate in this method can be controlled by the above temperature range, and can be selected in the range of 0.001 to 2 μm/min.

For the etching amount in this method, any etching amount can be adopted as long as the work-affected layer 11 of the SiC substrate 10 can be removed. As the etching amount, equal to or higher than 0.1 μm and equal to or lower than 20 μm can be exemplified, but the etching amount can be applied as necessary.

The etching time in this method can be set to any time so as to obtain a desired etching amount. For example, when the etching rate is 1 μm/min and the etching amount is desired to be 1 μm, the etching time is 1 minute.

The temperature gradient in this method is set in the range of 0.1 to 5° C./mm in the etching space S1.

EXAMPLES

The SiC substrate of Example 1 was manufactured by the following method.

Example 1

The SiC substrate 10 was accommodated in the main container 20 and the high melting point container 40 under the following conditions (arranging process).
[SiC Substrate 10]
    Polymorphism: 4H—SiC
    Substrate size: width 10 mm×length 10 mm×thickness 0.45 mm
    Off direction and off angle: <11-20> direction 4° off
    Etching surface: (0001) surface
    Depth of work-affected layer 11: 5 μm
    The depth of the work-affected layer 11 was checked by the SEM-EBSD method. The work-affected layer 11 can also be checked by the TEM, pXRD, or RAMAN spectroscopy.
[Main Container 20]
    Material: polycrystalline SiC
    Container size: diameter 60 mm×height 4 mm
    Material of substrate holder 24: single crystal SiC
    Distance between SiC substrate 10 and bottom surface of main container 20: 2 mm
[High Melting Point Container 40]
    Material: TaC
    Container size: diameter 160 mm×height 60 mm
    Si vapor supply source 44 (Si compound): $TaSi_2$
[Etching Process]
    The SiC substrate 10 arranged under the above conditions was subjected to heat treatment under the following conditions.
    Heating temperature: 1800° C.
    Heating time: 20 min
    Etching amount: 5 μm
    Temperature gradient: 1° C./mm
    Etching rate: 0.25 μm/min
    Vacuum degree of main heating chamber: $10^{-5}$ Pa
[Measurement of Work-Affected Layer 11 by SEM-EBSD Method]

The lattice distortion of the SiC substrate 10 can be obtained by comparison with a reference crystal lattice as a reference. As a means for measuring the lattice distortion, for example, a SEM-EBSD method can be used. The SEM-EBSD method is a method (Electron Back Scattering Diffraction: EBSD) in which distortion in a minute region can be measured on the basis of a Kikuchi ray diffraction pattern obtained by electron backscattering in a scanning electron microscope (SEM). In this method, the amount of lattice distortion can be obtained by comparing the diffraction pattern of the reference crystal lattice as a reference with the measured diffraction pattern of the crystal lattice.

As the reference crystal lattice, for example, a reference point is set in a region where lattice distortion is not considered to occur. That is, it is desirable to arrange the reference point in the region of the bulk layer 12 in FIG. 2. Typically, it is an established theory that the depth of the work-affected layer 11 is about 10 μm. Therefore, it is sufficient that the reference point is set at a position of about 20 to 35 μm in depth considered to be sufficiently deeper than the work-affected layer 11.

Next, the diffraction pattern of the crystal lattice at this reference point is compared with the diffraction pattern of the crystal lattice of each measurement region measured at a pitch on the order of nanometers. As a result, the lattice distortion amount of each measurement region with respect to the reference point can be calculated.

The case where the reference point at which it is considered that no lattice distortion occurs is set as the reference crystal lattice has been described, but it is of course possible to use an ideal crystal lattice of single crystal SiC as a reference or use a crystal lattice that occupies the majority (for example, a majority or higher) in the plane of the measurement region as a reference.

The presence or absence of the work-affected layer 11 can be determined by measuring whether lattice distortion is present by the SEM-EBSD method. That is, when processing damage such as the flaw 111, the latent flaw 112, and the strain 113 is introduced, lattice distortion occurs in the SiC substrate 10, and thus stress is observed by the SEM-EBSD method.

The work-affected layer 11 present in the SiC substrate 10 of Example 1 before and after the etching process was observed by the SEM-EBSD method. The results are shown in FIGS. 5 and 6.

In this measurement, a cross-section obtained by cleaving the SiC substrate 10 before and after the etching process of Example 1 was measured under the following conditions using a scanning electron microscope.

SEM device: Merline manufactured by Zeiss
EBSD analysis: OIM crystal orientation analysis device manufactured by TSL Solutions
Acceleration voltage: 15 kV
Probe current: 15 nA
Step size: 200 nm
Reference point R depth: 20 μm FIG. 5 is a cross-sectional SEM-EBSD imaging image of the SiC substrate 10 before the etching process of Example 1.

Figure 5:
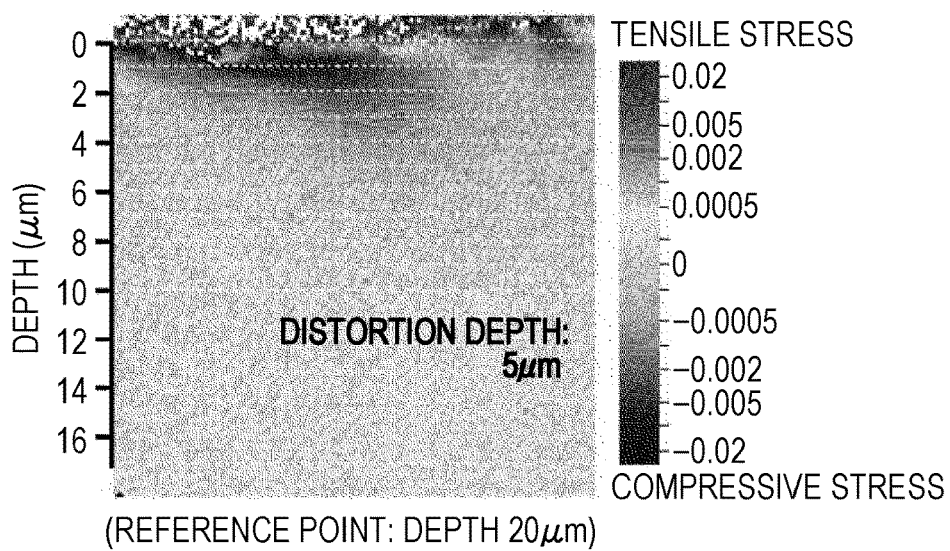
FIG. 5 is a cross-sectional SEM-EBSD imaging image of a SiC substrate before etching by the method for manufacturing a SiC substrate according to the embodiment.
Figure 6:
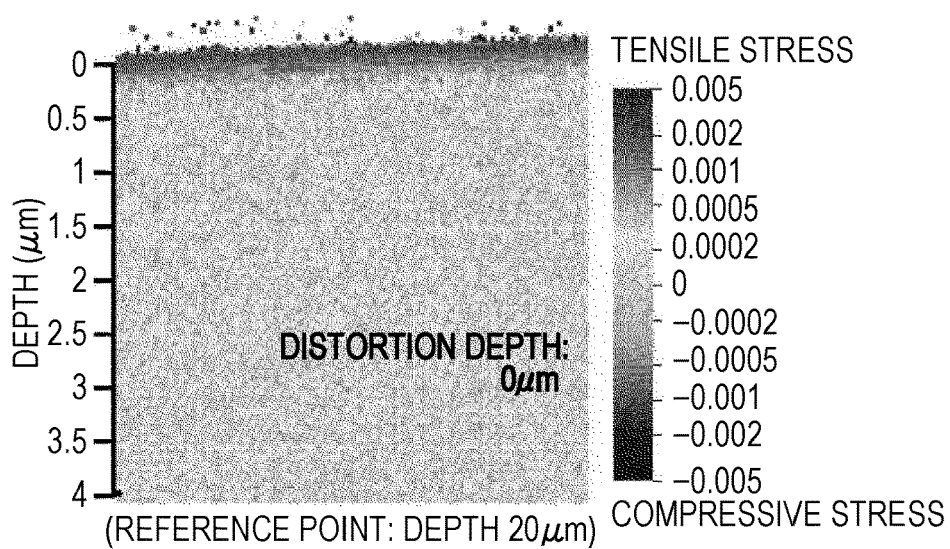
FIG. 6 is a cross-sectional SEM-EBSD imaging image of a SiC substrate after etching by the method for manufacturing a SiC substrate according to the embodiment.

As illustrated in FIG. 5, lattice distortion having a depth of 5 μm was observed in the SiC substrate 10 before the etching process. This is lattice distortion introduced during machining, and it can be seen that the work-affected layer 11 is included. In each case, compressive stress is observed.

FIG. 6 is a cross-sectional SEM-EBSD imaging image of the SiC substrate 10 after the etching process of Example 1.

As illustrated in FIG. 6, no lattice distortion was observed in the SiC substrate 10 after the etching process. That is, it can be seen that the work-affected layer 11 has been removed by the etching process.

The method for manufacturing a SiC substrate according to the present invention includes an etching process of etching a SiC substrate 10 by accommodating the SiC substrate 10 inside a main container 20 that generates vapor pressure of a gaseous species containing Si element and a gaseous species containing C element in an internal space, and heating the main container 20 in a manner to form a temperature gradient in vapor pressure of the gaseous species containing Si element.

As described above, the SiC substrate 10 is arranged in the main container 20 that generates the vapor pressure of the gaseous species containing Si element and the gaseous species containing C element in the internal space, and etching is performed using the temperature gradient of the heating furnace 30 as the driving force, and thereby, the SiC substrate from which the work-affected layer 11 has been reduced or removed can be manufactured.

REFERENCE SIGNS LIST

10 SiC substrate
101 Main surface
11 Work-affected layer
12 Bulk layer
20 Main container
24 Substrate holder
30 Heating furnace
40 High melting point container
44 Si vapor supply source
S1 Etching space

The invention claimed is:

1. A method for manufacturing a SiC substrate comprising an etching process of etching a SiC substrate by accommodating the SiC substrate inside a SiC main container and heating the SiC main container in a manner to form a temperature gradient under an environment of vapor pressure of the gaseous species containing Si element.

2. The method for manufacturing a SiC substrate according to claim 1,
the etching process including
a Si atom sublimation process of thermally sublimating Si atoms from a surface of the SiC substrate, and
a C atom sublimation process of sublimating C atoms from the surface of the SiC substrate by reacting C atoms remaining on the surface of the SiC substrate with Si vapor in the SiC main container.

3. The method for manufacturing a SiC substrate according to claim 1, wherein, in the etching process, the SiC substrate arranged on a high temperature side of the temperature gradient and a portion of the SiC main container arranged on a low temperature side of the temperature gradient are etched while facing each other.

4. A method for reducing a work-affected layer of a SiC substrate comprising an etching process of etching a SiC substrate inside a SiC main container, wherein
the etching process is a process of heating an etching space inside the SiC main container in which the SiC substrate is arranged on a high temperature side of a temperature gradient.

5. The method according to claim 4, wherein the etching process is a process of performing etching by arranging the SiC substrate in the etching space in which air is exhausted through an environment of vapor pressure of a gaseous species containing Si element.

6. The method according to claim 4, wherein the etching process is a process of performing etching by making the SiC substrate arranged on the high temperature side of the temperature gradient face a portion of the SiC main container arranged on a low temperature side of the temperature gradient.

7. A method for manufacturing a SiC substrate comprising an etching process of etching a SiC substrate inside a SiC main container,
wherein the etching process is a process of heating an etching space inside the SiC main container in which the SiC substrate is arranged on a high temperature side of a temperature gradient.

8. The method for manufacturing a SiC substrate according to claim 7, wherein the etching process is a process of performing etching by arranging the SiC substrate in the etching space in which air is exhausted through an environment of vapor pressure of a gaseous species containing Si element.

9. The method for manufacturing a SiC substrate according to claim 7, wherein the etching process is a process of performing etching by making the SiC substrate arranged on the high temperature side of the temperature gradient face a portion of the SiC main container arranged on a low temperature side of the temperature gradient.

* * * * *